(12) United States Patent
Pasadyn et al.

(10) Patent No.: US 6,756,243 B2
(45) Date of Patent: Jun. 29, 2004

(54) METHOD AND APPARATUS FOR CASCADE CONTROL USING INTEGRATED METROLOGY

(75) Inventors: Alexander J. Pasadyn, Austin, TX (US); Christopher A. Bode, Austin, TX (US)

(73) Assignee: Advanced Micro Devices, Inc., Austin, TX (US)

(*) Notice: Subject to any disclaimer, the term of this patent is extended or adjusted under 35 U.S.C. 154(b) by 47 days.

(21) Appl. No.: 10/020,551

(22) Filed: Oct. 30, 2001

(65) Prior Publication Data

US 2003/0082837 A1 May 1, 2003

(51) Int. Cl.⁷ ............................................. H01L 21/66
(52) U.S. Cl. ........................................................ 438/14
(58) Field of Search ............................. 438/14; 700/121

(56) References Cited

U.S. PATENT DOCUMENTS

| | | | |
|---|---|---|---|
| 5,698,989 A | 12/1997 | Nulman | 324/719 |
| 5,987,398 A | 11/1999 | Haverson et al. | 702/179 |
| 6,197,604 B1 | 3/2001 | Miller et al. | 438/14 |
| 6,408,220 B1 * | 6/2002 | Nulman | 700/121 |

FOREIGN PATENT DOCUMENTS

WO 99/61320 12/1999 ............ B65B/31/01

OTHER PUBLICATIONS

International Search Report dated Jul. 14, 2003 for International application No. PCT/US02/25402 Filed Aug. 9, 2002.

* cited by examiner

Primary Examiner—John F. Niebling
Assistant Examiner—Andre' C. Stevenson
(74) Attorney, Agent, or Firm—Williams, Morgan & Amerson, P.C.

(57) ABSTRACT

A method and an apparatus for performing cascade control of processing of semiconductor wafers. A first semiconductor wafer for processing is received. A second semiconductor wafer for processing is received. A cascade processing operation upon the first and the second semiconductor wafers is performed, wherein the cascade processing operation comprises acquiring pre-process metrology data related to the second semiconductor wafer during at least a portion of a time period wherein the first semiconductor wafer is being processed.

24 Claims, 11 Drawing Sheets

METHOD AND APPARATUS FOR CASCADE CONTROL USING INTEGRATED METROLOGY

BACKGROUND OF THE INVENTION

1. Field of the Invention

This invention relates generally to semiconductor manufacturing, and, more particularly, to a method and apparatus for performing a cascading processing of semiconductor wafers.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed on a group of semiconductor wafers, sometimes referred to as a lot. For example, a process layer composed of a variety of materials may be formed above a wafer. Thereafter, a patterned layer of photoresist may be formed above the process layer using known photolithography techniques. Typically, an etch process is then performed on the process layer using the patterned layer of photoresist as a mask. This etching process results in formation of various features or objects in the process layer. Such features may be used for a gate electrode structure for transistors. Many times, trench structures are also formed on the substrate of the semiconductor wafer. One example of a trench structure is a shallow trench isolation (STI) structure, which can be used to isolate electrical areas on a semiconductor wafer. Typically, STI structures formed on the semiconductor wafers are filled by forming silicon dioxide using tetraethoxysilane (TEOS), over the wafer and in the STI structures.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

Figure 1:
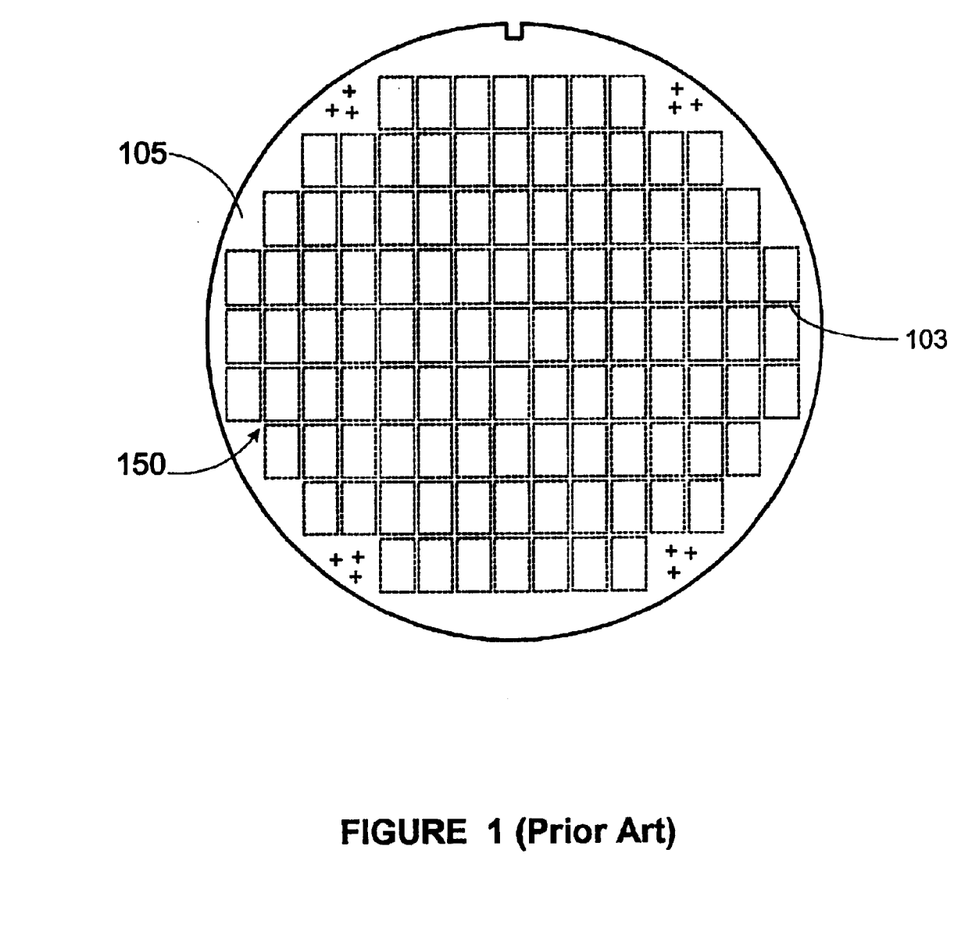
FIG. 1 is a simplified diagram of a prior art semiconductor wafer being processed.

FIG. 1 illustrates a typical semiconductor wafer 105. The wafer 105 typically includes a plurality of individual semiconductor die 103 arranged in a grid 150. Photolithography steps are typically performed by a stepper on approximately one to four die locations at a time, depending on the specific photomask employed. Photolithography steps are generally performed to form patterned layers of photoresist above one or more process layers that are to be patterned. The patterned photoresist layer can be used as a mask during etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features, such as a polysilicon line, or opening-type features, that are to be replicated in an underlying process layer.

Figure 2:
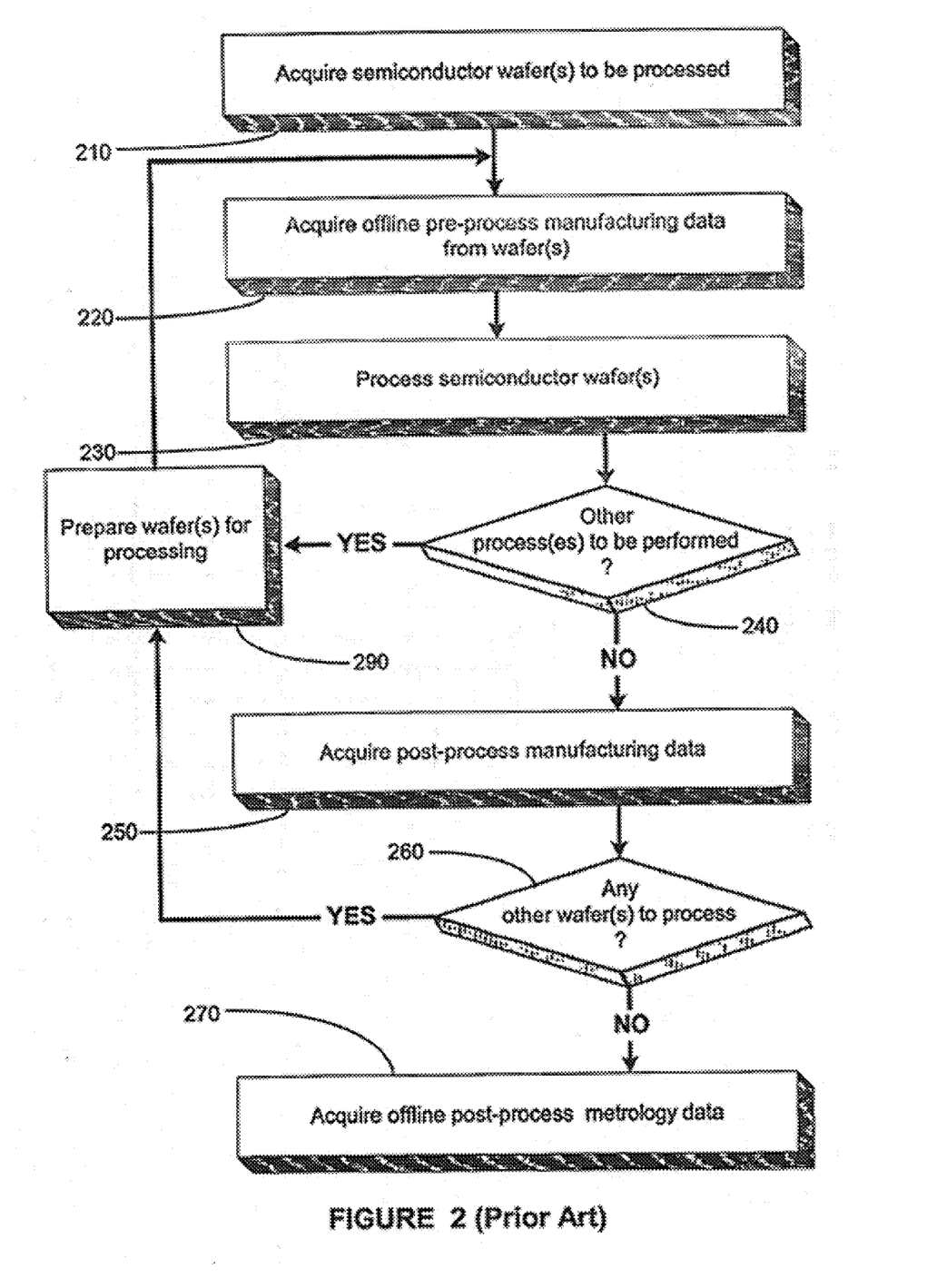
FIG. 2 illustrates a simplified flowchart depiction of a prior art process flow during manufacturing of semiconductor wafers.

Conventional procedures during manufacturing of semiconductor wafers call for a set of steps that are performed in series. Turning now to FIG. 2, a flowchart depiction of such steps are illustrated. The manufacturing system acquires semiconductor wafers 105 that are to be processed (block 210). Once a set of wafers 105 to be processed is acquired, the manufacturing system acquires pre-processing manufacturing data (e.g., metrology data and the like) from the semiconductor wafers 105 (block 220).

For certain processes, the manufacturing data acquired from the wafer 105 may involve a pre-process screening of the semiconductor wafers 105. For example, before performing a chemical-mechanical polishing (CMP) process, pre-processing data acquired from the semiconductor wafers 105 that are about to processed, can be used to set control parameters that affect the CMP process. Once pre-processing data is acquired, the manufacturing system processes the semiconductor wafers 105 (block 230).

After processing the semiconductor wafers 105, the manufacturing system determines whether additional processes are to be performed on the semiconductor wafers 105 (block 240). When the manufacturing system determines that additional processes are to be performed on the semiconductor wafers 105, pre-process metrology data may be acquired and additional processes are performed on the semiconductor wafers 105 (see flowchart path: block 230—block 240—block 220). The manufacturing system may use a plurality of processing tools to perform a plurality of processing on the semiconductor wafers 105.

When the manufacturing system determines that additional processes are not to be performed on the semiconductor wafers 105, the manufacturing system may acquire post-process manufacturing data from the processed wafers 105 (block 250). Generally, the post-process manufacturing data includes measurements of a plurality of structures formed on the semiconductor wafers 105. If there are other semiconductor wafers 105 to be processed, as determined in block 260, the manufacturing system acquires the next wafer 105 to be processed and repeats the processes described above (blocks 250, 270). Alternatively, if there are no additional semiconductor wafers 105 to be processed, the manufacturing system stops the processing mode (block 270).

The steps illustrated by FIG. 2 are generally performed in series, causing the manufacturing system to execute frequent breaks in the process flow. Acquiring pre-process data using a metrology tool, then processing the wafer 105, then acquiring post-process manufacturing data, can be an inefficient process when performed in series. Any interruption in a process flow of semiconductor wafers can cause inefficiencies and errors. Manufacturing time lost due to such inefficiencies can be very costly, and can adversely affect product delivery schedules. Errors in the semiconductor wafers 105 can adversely affect the yields of the devices produced from the processed semiconductor wafers 105.

The present invention is directed to overcoming, or at least reducing the effects of, one or more of the problems set forth above.

SUMMARY OF THE INVENTION

In one aspect of the present invention, a method is provided for performing cascade control of processing of semiconductor wafers. A method and an apparatus for performing cascade control of processing of semiconductor wafers. A first semiconductor wafer for processing is received. A second semiconductor wafer for processing is received. A cascade processing operation upon the first and the second semiconductor wafers is performed, wherein the cascade processing operation comprises acquiring pre-process metrology data related to the second semiconductor wafer during at least a portion of a time period wherein the first semiconductor wafer is being processed.

In another aspect of the present invention, a system is provided for performing cascade control of processing of semiconductor wafers. The system of the present invention comprises: a process controller to perform a cascade process operation, the cascade process operation comprising: acquiring pre-process data related to a first semiconductor wafer; processing the first semiconductor wafer after the acquiring of the pre-process data relating to the first semiconductor wafer; acquiring pre-process data related to a second semiconductor wafer during at least a portion of a time period wherein the first semiconductor wafer being processed; processing the second semiconductor wafer after the acquiring of the pre-process data related to the second semiconductor wafer acquiring post-process data related to the first semiconductor wafer during at least a portion of a time period wherein the second semiconductor wafer is being processed; and acquiring post-process data related to the second semiconductor wafer after the processing of the second semiconductor wafer. The system also comprises: an inline cascade metrology data storage unit operatively coupled to the process controller, the inline cascade metrology data storage unit to receive at least one of an inline pre-process metrology data and an inline post-process metrology data; and a feedback/feed-forward unit operatively coupled to the process controller and the inline cascade metrology data storage unit, the feedback/feed-forward unit to perform a feedback function in response to at least one of the inline pre-process metrology data and the inline post-process metrology data.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Often, manufacturing data, including metrology data, is collected before and/or after some processes are performed. For example, before a chemical-mechanical polishing (CMP) process is performed, it is desirable to collect pre-processing data to determine how much polishing is to be performed. Similarly, after performing a deposition process, it is desirable to collect post-processing data to determine how much material was deposited on the semiconductor wafer, and to adjust control parameters of subsequent processes performed on the semiconductor wafer. However, acquiring pre-process and post-process metrology data, particularly in an offline manner, can cause a manufacturing process flow to become inefficient. Embodiments of the present invention provide for performing a metrology data acquisition and manufacturing process steps in a cascading fashion, resulting in more efficient process flow.

Figure 7:
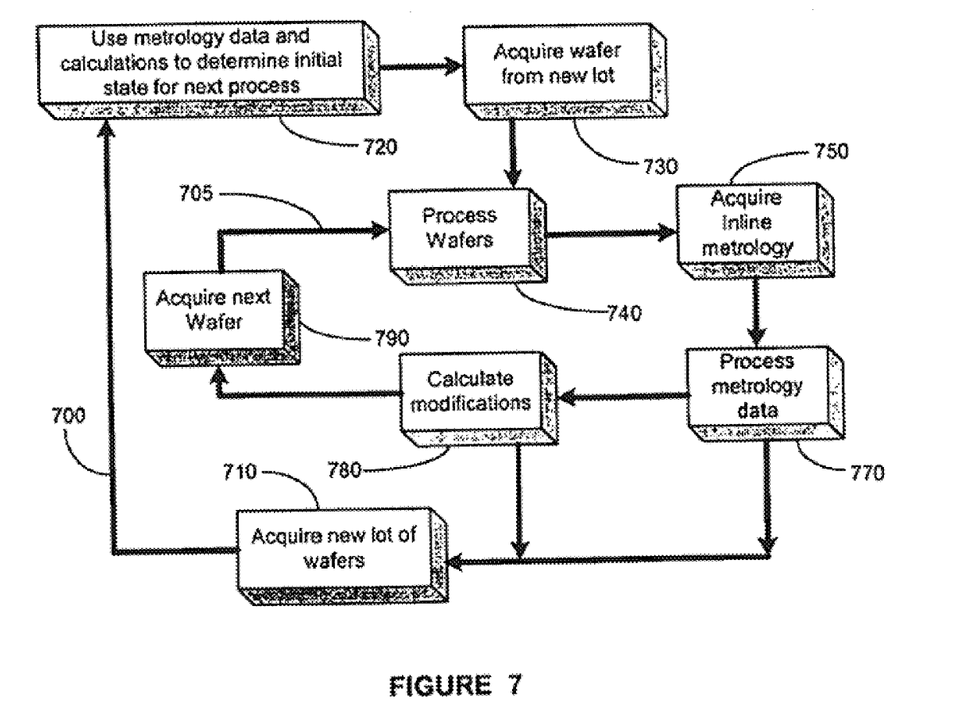
FIG. 7 illustrates a block diagram representation of a run-to-run feedback loop and a wafer-to-wafer feedback loop utilized in a manufacturing system, in accordance with one illustrative embodiment of the present invention.

In one embodiment, the cascading control system provided by embodiments of the present invention refers to a nested system of control loop. The cascade system provided by embodiments of the present invention provides an inner, wafer-to-wafer control loop (e.g., a first feedback loop) and an outer, lot-to-lot control loop (e.g., a second feedback loop). In one embodiment, an inner feedback loop provides a wafer-to-wafer control loop, while an outer feedback loop provides a lot-to-lot control loop, which are illustrated in FIG. 7 and accompanying description.

Figure 3:
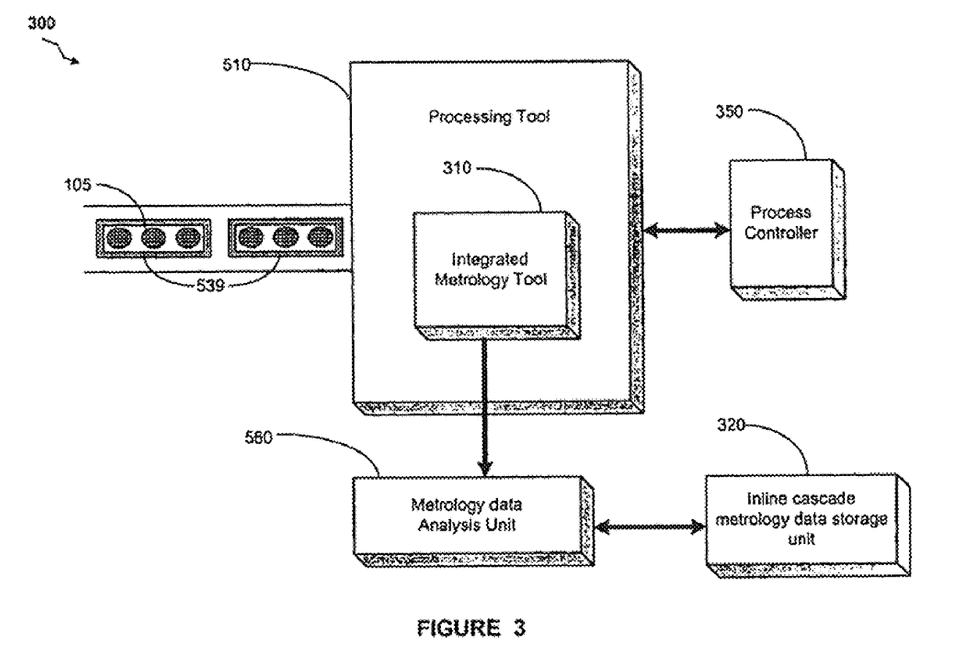
FIG. 3 is a block diagram representation of a system in accordance with one illustrative embodiment of the present invention.

Turning now to FIG. 3, a system 300 capable of performing the methods taught by one embodiment of the present invention, is illustrated. In one embodiment, a processing tool 510 comprises an integrated metrology tool 310. In one embodiment, the integrated metrology tool 310 is capable of acquiring inline metrology data (e.g., acquiring metrology data of semiconductor wafer 105 while they are still under the control of the processing tool 510). Acquiring inline metrology data is generally less intrusive to a manufacturing process flow, as compared to acquiring offline metrology data, which requires the use of an external metrology data tool. A set of semiconductor wafers 105 in a cassette 539 are provided to the processing tool 510. Embodiments of the present invention provide for the processing tool 510 to perform a cascade processing function using the integrated metrology tool 310. The process of performing the cascade processing function is controlled by a process controller 350.

In one embodiment, a cascade processing function includes performing a plurality of manufacturing functions in a sequential and/or overlapping manner. For example, a cascade processing function, in accordance with one embodiment of the present invention, provides for: acquiring pre-process metrology data relating to a first set of semiconductor wafers 105; processing the first set of semiconductor wafers 105 in at least a portion of a time period, during which pre-process data for a second set of semiconductor wafers 105 is acquired; and acquiring post-process metrology data relating to the first set of semiconductor wafers 105 in at least a portion of a time period, during which processing of the second set of semiconductor wafers 105 is performed. This cascading process provides for more efficient processing flow in which a plurality of semiconductor wafers 105 are processed and analyzed. In one embodiment, the pre-process and post-process metrology data is acquired using an integrated metrology tool, which is described in more detail below.

Data acquired by the integrated metrology tool 310 is sent to a metrology data analysis unit 560. The metrology data analysis unit 560 organizes, analyses, and correlates metrology data acquired by the offline metrology tool 550 (see FIG. 5) to particular semiconductor wafers 105 that were examined. The metrology data analysis unit 560 can be a software unit, a hardware unit, or a firmware unit. In various embodiments, the metrology data analysis unit 560 is integrated into the computer system 530 or may be integrated into the offline metrology tool 550.

In one embodiment, the system 300 stores inline cascade metrology data, acquired by the integrated metrology tool 310, while performing a cascade process operation, into the inline cascade metrology data storage unit 320. The metrology data stored in the inline cascade metrology data storage unit 320 includes sets of data that represent the line width of structures formed on the semiconductor wafer 105, the trench depth of an STI trench, the side-wall angle (with respect to the vertical plane) of trench structures formed on the semiconductor wafer 105, and the like. In one embodiment, data in the inline cascade metrology data storage unit 320 can be used for feedback correction in order to improve the efficiency and accuracy of processing of semiconductor wafers 105.

Figure 4:
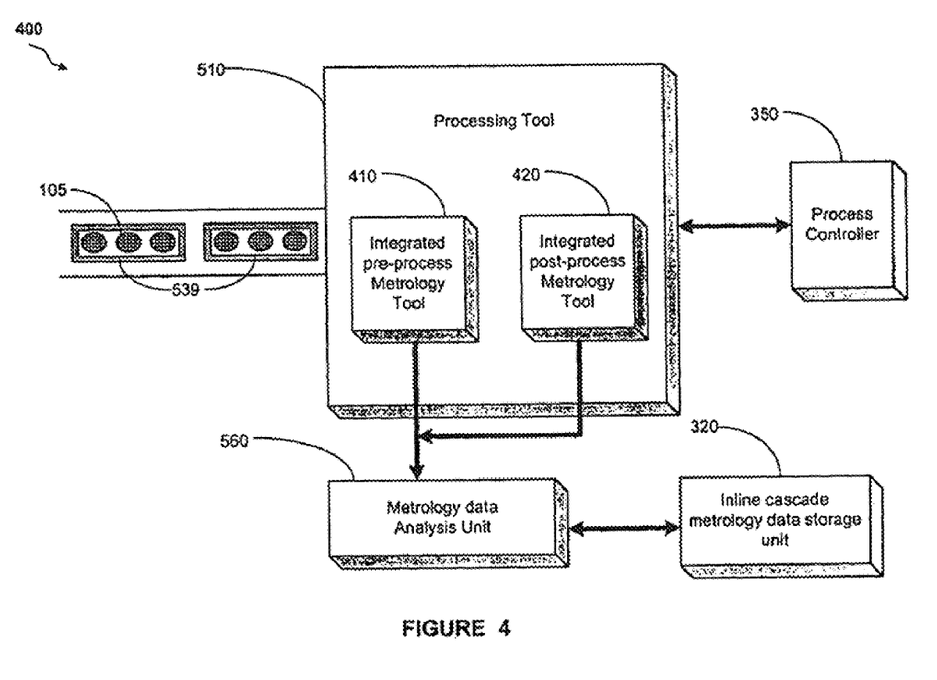
FIG. 4 is a block diagram representation of a system in accordance with an alternative illustrative embodiment of the present invention.

Turning now to FIG. 4, an alternative embodiment of the processing tool 510, employed by the system 300 to perform a cascade processing function, is illustrated. The processing tool 510 illustrated in FIG. 4 comprises an integrated pre-process metrology tool 410 and an integrated post-process metrology tool 420. Semiconductor wafers 105 are analyzed by the integrated pre-process metrology tool 410 before they are processed. For example, the semiconductor wafers 105 are analyzed by the integrated pre-process metrology tool 410 before the processing tool performs a CMP process upon the semiconductor wafer 105. The resulting pre-process metrology data can then be used to control the CMP process more accurately.

Many times, subsequent to processing a semiconductor wafer 105, the processing tool 510 acquires post-process metrology data using the integrated post-process metrology tool 420. Meanwhile, a second set of semiconductor wafers 105, carried by a second cassette 539 is sent to the pre-process integrated metrology tool 410 for analysis before being processed by the processing tool 510. Using the cascade processing technique, the processing tool 510 can perform pre-process data acquisition, processing of semiconductor wafers 105, and post-process integrated metrology data acquisition in a cascade manner, such that the capabilities of the processing tool 510 is utilized in a more simultaneous and efficient fashion. The integrated pre-process metrology tool 410 and the integrated post-process metrology tool 420 send their respective data to the metrology data analysis unit 560 for processing. The metrology data is then stored in the inline cascade metrology data storage unit 320, which is then available for the system 300 for performing more efficient feedback analysis. The process of performing the cascade processing function illustrated in FIG. 4 is controlled by a process controller 350.

Figure 5:
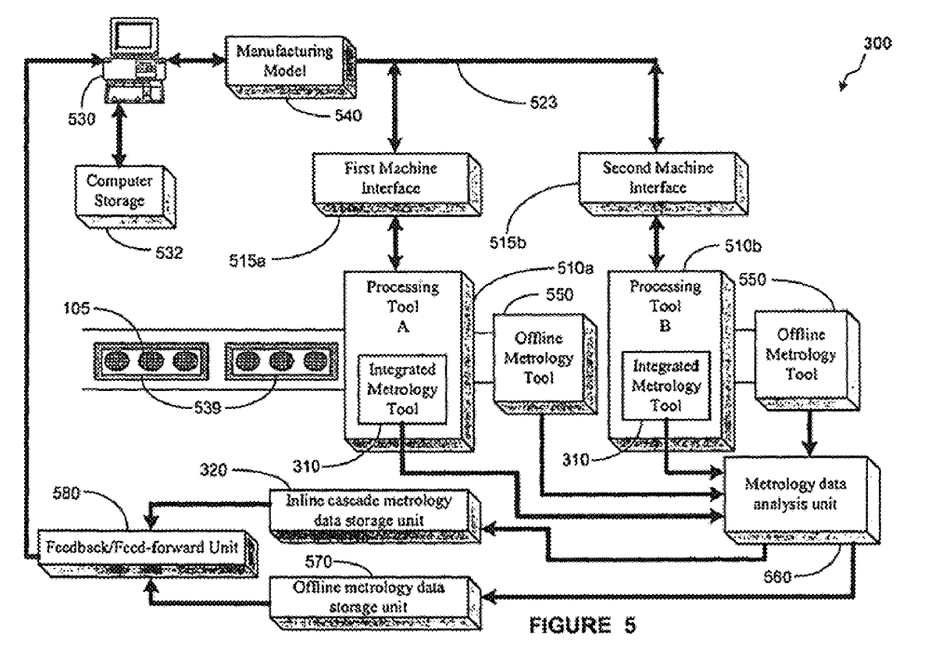
FIG. 5 illustrates a more detailed block diagram representation of a processing tool shown in FIG. 4, in accordance with one illustrative embodiment of the present invention.

Turning now to FIG. 5, a more detailed block diagram of the system 300 in accordance with one embodiment of the present invention is illustrated. In one embodiment, semiconductor wafers 105, are processed on processing tools 510a, 510b using a plurality of control input signals, or manufacturing parameters, on a line 523. In one embodiment, control input signals, or manufacturing parameters, on the line 523 are sent to the processing tools 510a, 510b from a computer system 530 via machine interfaces 515a, 515b. In one embodiment, the first and second machine interfaces 515a, 515b are located outside the processing tools 510a, 510b. In an alternative embodiment, the first and second machine interfaces 515a, 515b are located within the processing tools 510a, 510b. The semiconductor wafers 105 are provided to and carried from a plurality of processing tools 510. In one embodiment, semiconductor wafer 105 may be provided to a processing tool 510 manually. In an alternative embodiment, semiconductor wafer 105 may be provided to a processing tool 510 in an automatic fashion (e.g., robotic movement of semiconductor wafer 105). In one embodiment, a plurality of semiconductor wafers 105 are transported in lots (e.g., stacked in the cassettes 539) to the processing tools 510.

In one embodiment, the computer system 530 sends control input signals, or manufacturing parameters, on the line 523 to the first and second machine interfaces 515a, 515b. The computer system 530 is capable of controlling processing operations. The computer system 530 is coupled to a computer storage 532 that may contain a plurality of software programs and data sets. The computer system 530 may contain one or more processors (not shown) that are capable of performing the operations described herein. The computer system 530 employs a manufacturing model to generate control input signals on the line 523. In one embodiment, the manufacturing model 540 contains a manufacturing recipe that determines a plurality of control input parameters that are sent on the line 523.

In one embodiment, the manufacturing model 540 defines a process script and input control that implement a particular manufacturing process. The control input signals (or control input parameters) on the line 523 that are intended for processing tool A 510a are received and processed by the first machine interface 515a. The control input signals on the line 523 that are intended for processing tool B 510b are received and processed by the second machine interface 515b. Examples of the processing tools 510a, 510b used in semiconductor manufacturing processes are steppers, etch process tools, and the like.

One or more of the semiconductor wafers 105 that are processed by the processing tools 510a, 510b can also be sent to an offline metrology tool 550 for acquisition of metrology data. The offline metrology tool 550 can be a scatterometry data acquisition tool, an overlay-error measurement tool, a critical dimension measurement tool, and the like. In one embodiment, one or more processed semiconductor wafers 105 are examined by a metrology tool 550. Furthermore, metrology data is collected by the integrated metrology tool 310 within the processing tools 510. Data from the integrated metrology tool 310 and the offline metrology tool 550 are collected by the metrology data analysis unit 560. The data may include line width measurement, depth of trenches, sidewall angles, and the like. As described above, the metrology data analysis unit 560 organizes, analyses, and correlates metrology data acquired by the metrology tool 550 to particular semiconductor wafers 105 that were examined.

In one embodiment, the metrology data analysis unit 560 sends inline cascade metrology data from the integrated metrology tool 310 to the inline cascade metrology data storage unit 320 for storage. Furthermore, metrology data analysis unit 560 sends offline metrology data to an offline metrology data storage unit 570 for storage. The system 300 is able to retrieve inline cascade metrology data and offline metrology data and perform feedback and feed-forward analysis. The inline metrology data and the offline metrology data are sent to the feedback/feed-forward unit 580 for generation of feedback and feed-forward data. The feedback and feed-forward data are analyzed by the computer system 530, which then uses the manufacturing model 540 to modify control input parameters that control the operation of the processing tools 510. In one embodiment, the inline cascade metrology data storage unit 320, the offline metrology data storage unit 570, and/or the feedback/feed-forward unit 580 are software or firmware components that can be a standalone unit or can be integrated into the computer system 530.

Figure 6:
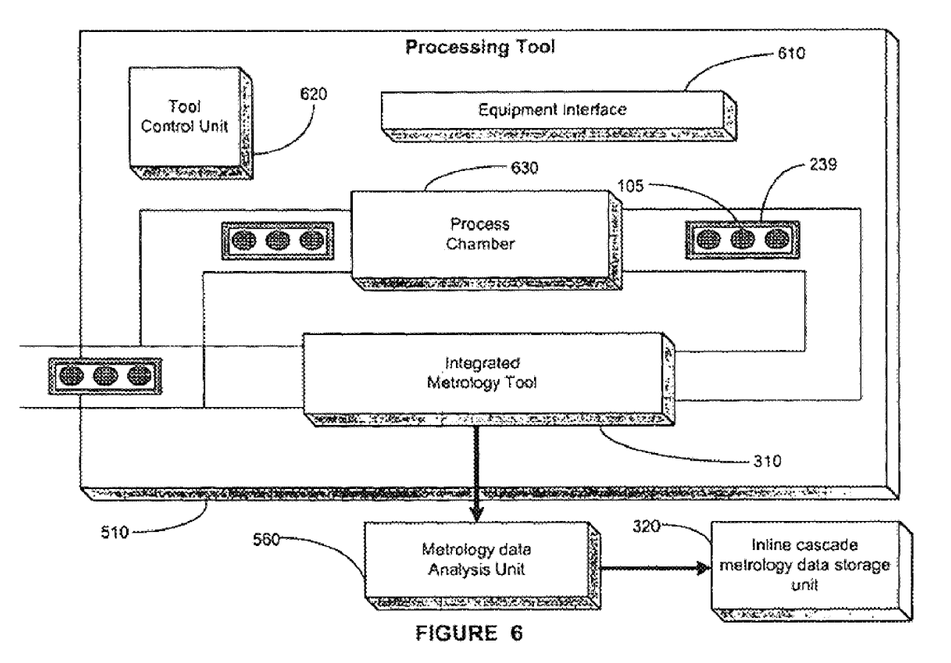
FIG. 6 illustrates a more detailed block diagram representation of the system shown in FIGS. 3 and 4, in accordance with one illustrative embodiment of the present invention.

Turning now to FIG. 6, a more detailed illustration of the processing tool and the process flow in accordance with one embodiment of the present invention is illustrated. In one embodiment, the processing tool comprises an equipment interface 610, a tool control unit 620, a processing chamber 630, and an integrated metrology tool 310. The equipment interface 610 facilitates communications between the processing tool 510 and other parts of the system 300, such as the computer system 530, the manufacturing model 540, and the machine interface 515. The tool control unit 620 controls the operations of the processing tools 510. The tool control unit 620 is capable of receiving instructions and data from the computer system 530, via the equipment interface 610. The tool control unit 620 is also capable of sending data, such as integrated metrology data, to other portions of the system 300 via the equipment interface 610.

A first set of semiconductor wafers 105, carried by the cassette 539, is received by the processing tool 510 and examined by the integrated metrology tool 310 for pre-process metrology data acquisition. The first set of semiconductor wafers 105 are then sent to the chamber 630 for processing. Meanwhile, a second set of semiconductor wafers 105 is received by the integrated metrology tool 310 for pre-process metrology data acquisition.

During the approximate time that the metrology data is acquired from the second set of semiconductor wafers 105, the first set of semiconductor wafers 105 can be processed by the chamber 630. Upon completion of the processing of the first set of semiconductor wafers 105, the tool control unit 620 prompts the integrated metrology tool 310 to acquire post-process metrology data from the processed first set of semiconductor wafers 105. Meanwhile, the second set of semiconductor wafers 105 are sent to the process chamber 630 for processing. This cascade process system produces a significant amount of quickly acquired metrology data that can be used for immediate feedback analysis. Data from the integrated metrology tool 310 is sent to the metrology data analysis tool 560. The metrology data is then stored into the inline cascade metrology data storage unit 320 for retrieval by system 300 for feedback processing. Subsequently, a third, a fourth, and a fifth through nth set of semiconductor wafers 105 can be processed in the cascade fashion described above for efficient usage of the processing tool 510. Furthermore, more immediate use of metrology data for feedback and feed-forward processes are possible using embodiments of the present invention.

In one embodiment, the system 300, using the methods taught by embodiments of the present invention, can perform the multiple feedback loops to improve the efficiency and accuracy of the manufacturing of semiconductor wafers 105. Turning now to FIG. 7, two feedback loops that are used during semiconductor wafer manufacturing are illustrated. The feedback loops utilized by the system 300 includes a run-to-run feedback loop 700 and a wafer-to-wafer feedback loop 705. Both feedback loops (700 and 705) can be used in concert during a manufacturing process for adjustment of control input parameters. In other words, both feedback loops (700 and 705) can be used to perform a cascading controlling function during processing of semiconductor wafers 105.

The inner loop, which is the wafer-to-wafer feedback loop 705, comprises processing a semiconductor wafer 105 (block 740) and acquiring inline metrology data from the processed semiconductor wafer 105 (block 750). The system 300 then processes the metrology data, which includes calculating the amount of error existing on the semiconductor wafer 105 (block 770). The system 300 then calculates modifications to control input parameters that control the processing tools 510, based upon the errors (block 780). The system then acquires the next semiconductor wafer 105 to be processed, and the wafer 105 is processed using the modified control input parameters (block 790—block 740), thereby forming a wafer-to-wafer feedback loop 705.

Using the wafer-to-wafer feedback loop 705, errors acquired from the processing of one semiconductor wafer 105 can be acquired quickly using the inline metrology tool 310. The metrology data is then processed and used as feedback data for the processing of the next semiconductor wafer 105. The wafer-to-wafer feedback loop 705 illustrated in FIG. 7 provides for more accurate correction of errors within a particular lot of semiconductor wafers 105.

The run-to-run feedback loop 700 is created approximately simultaneously with the wafer-to-wafer feedback loop 705 by collecting the calculated errors and modifications and using them to correct errors during the next set of semiconductor wafers 105. The system 300 acquires a new lot of semiconductor wafers 105 (block 710) and uses data and calculations acquired from the wafer-to-wafer feedback loop 705 to define an initial state of the control input parameters used for processing the next lot of semiconductor wafers 105 (block 720). The system 300 then acquires semiconductor wafers 105 from the new lot of semiconductor wafers 105 and sends them to be processed (block 730 through block 740). The wafer-to-wafer feedback loop 705 is then repeated and the resulting calculations are used for a subsequent lot of semiconductor wafers 105. Therefore, two feedback loops, the run-to-run feedback loop 700 and the wafer-to-wafer feedback loop 705 are used separately, and sometimes simultaneously, to manufacture more efficiently and accurately processed semiconductor wafers 105.

Figure 8:
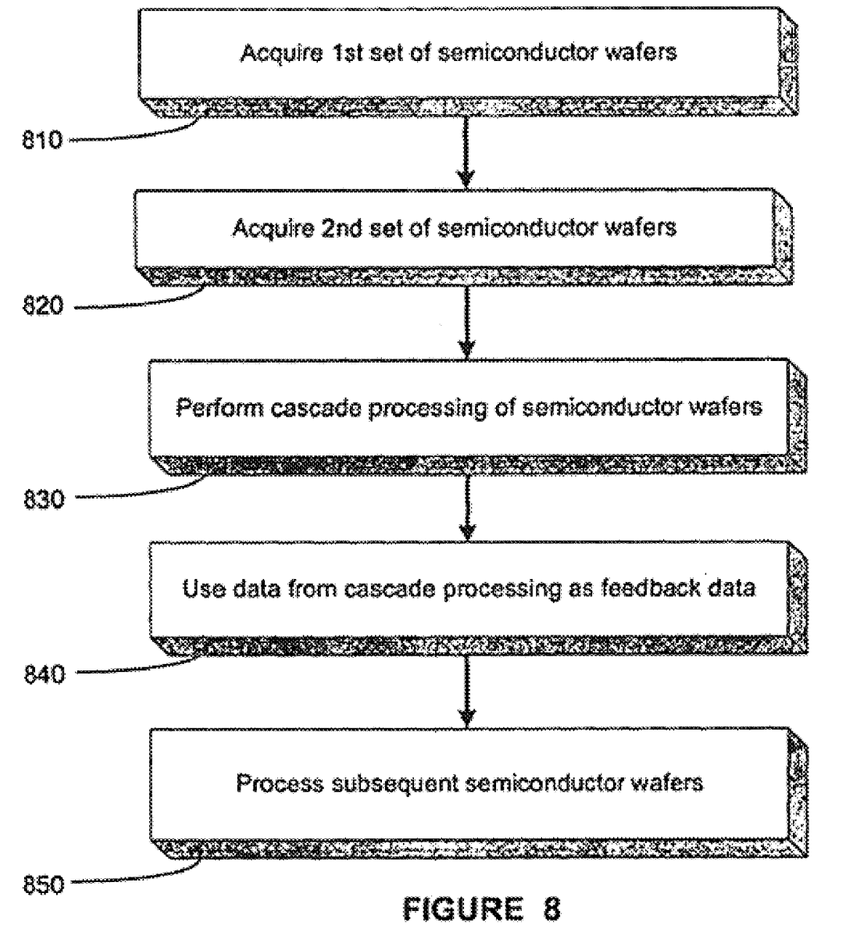
FIG. 8 illustrates a flowchart depiction of a method in accordance with one illustrative embodiment of the present invention.

Turning now to FIG. 8, a flowchart depiction of a method in accordance with one embodiment of the present invention, is illustrated. The system 300 acquires a first set of semiconductor wafers 105 for processing (block 810). The tool control unit 620 in the processing tool 510 receives data and control input parameters via the equipment interface 610, for processing the incoming first set of semiconductor wafers 105. The system 300 also sends a second set of semiconductor wafers 105 to the processing tool 510 for processing (block 820).

In one embodiment, the first and the second set of semiconductor wafers 105 are sent to the processing tool 510 in cassettes 539. In an alternative embodiment, the system 300 receives more than two sets of semiconductor wafers 105 in various cassettes 539. The system 300 performs a cascade processing operation on the plurality of sets of semiconductor wafers 105 (block 830). A more detailed illustration of the steps for performing the cascade processing indicated in block 830 is provided below (see FIG. 9 and accompanying description).

Continuing referring to FIG. 8, once the system 300 performs the cascade processing operation, the system 300 uses data resulting from the cascade processing operation as feedback data (block 840). In one embodiment, the system 300 uses metrology data acquired during the cascade processing to perform a wafer-to-wafer feedback 705, as well as a run-to-run feedback 700. Using the feedback data, the system 300 processes subsequent wafers 105 using modified control parameters in order to reduce the errors detected (block 850).

Figure 9:
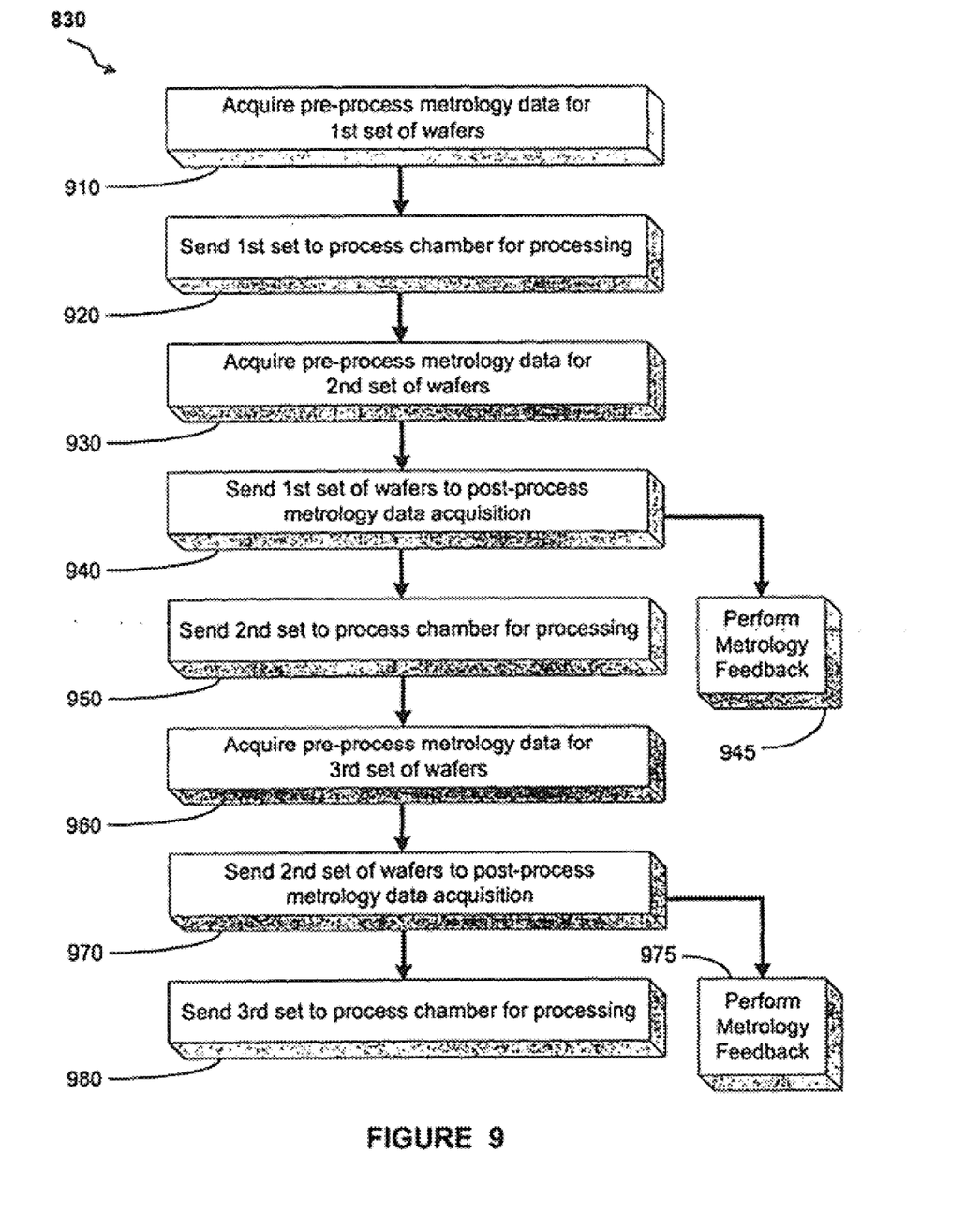
FIG. 9 illustrates a flowchart depiction of a method of performing a cascade processing of semiconductor wafers, as indicated in FIG. 6, in accordance with one illustrative embodiment of the present invention.

Turning now to FIG. 9, a flowchart depiction of the steps for performing the cascade processing operation indicated in block 830 of FIG. 8, in accordance with one embodiment of the present invention, is illustrated. The system 300 acquires pre-process metrology data for the first set of semiconductor wafers 105 (block 910). In one embodiment, the pre-process metrology data is performed using the integrated metrology tool 310 located within the processing tool 510. Once the processing tool 510 acquires pre-processing metrology data from the first set of semiconductor wafers 105, the processing tool 510 sends the first set of semiconductor wafers 105 from its integrated metrology tool 310 to its process chamber 630 for processing (block 920). In one embodiment, the tool control unit 620 controls the movement of multiple sets of semiconductor wafers 105 within the processing tool 510.

The processing tool 510 then acquires pre-processing metrology data from the second set of semiconductor wafers 105 (block 930). The pre-processing metrology data for the second set of semiconductor wafers 105 are acquired using the integrated metrology tool 310. In one embodiment, the processing of the first set of semiconductor wafers 105 in the chamber 630 and the acquisition of pre-processing metrology data for the second set of semiconductor wafers 105 acquired by the integrated metrology tool 310 is performed approximately during overlapping periods of time. In one embodiment, the pre-processing metrology data can be used to modify control settings for a subsequent processing of semiconductor wafers 105 in a feed-forward control fashion.

Upon completion of the processing of the first set of semiconductor wafers 105, the processing tool 510 sends the semiconductor wafers 105 to a post-process metrology data acquisition step (block 940). In one embodiment, the post-process metrology data acquisition is performed by the integrated metrology tool 310. In an alternative embodiment, the pre-processing metrology data is acquired by a separate pre-process integrated metrology tool 410, and the post-process metrology data acquisition is performed by a separate post-process integrated metrology tool 420. In the illustrative embodiment described in FIG. 9, the pre-processing metrology data and the post-process metrology data are both acquired by the integrated metrology tool 310. In one embodiment, the post-processing metrology data can be used to modify control settings to modify subsequent processing of semiconductor wafers 105 in order to compensate for errors from previous processing of the semiconductor wafers 105, in a feedback control fashion.

While the system 300 is acquiring post-processing metrology data from the first set of semiconductor wafers 105, the processing tool 510 sends the second set of semiconductor wafers 105 to the process chamber 630 for processing (block 950). Meanwhile, the data acquired from the first set of semiconductor wafers 105 (i.e., the pre-process metrology data and the post-process metrology data) are used to perform a metrology feedback for a wafer-to-wafer feedback loop 705 and a run-to-run feedback loop 700 (block 945). One illustrative embodiment of performing the metrology feedback loop is described below, as well as in its accompanying description (see FIG. 11).

Continuing referring to FIG. 9, while the second set of semiconductor wafers 105 are being processed in the chamber 630, the system 300 sends a third set of semiconductor wafers 105 to the processing tool 510. The third set of semiconductor wafers 105 are sent to the integrated metrology data acquisition tool 310 for pre-processing metrology data acquisition (block 960). Once the second set of semiconductor wafers 105 are processed in the chamber 630, the second set of semiconductor wafers 105 are sent to the post-process metrology data acquisition step (block 970). Subsequently, the third set of semiconductor wafers are sent to the chamber 630 for processing (block 980). Meanwhile, a second metrology feedback process is initiated using metrology data relating to the second set of semiconductor wafers 105 (i.e., the pre-process and post-process metrology data relating to the second set of semiconductor wafers 105)

(block 975). This process of cascade processing can be repeated for a plurality of sets of semiconductor wafers 105 using integrated metrology tools 310.

Figure 10:
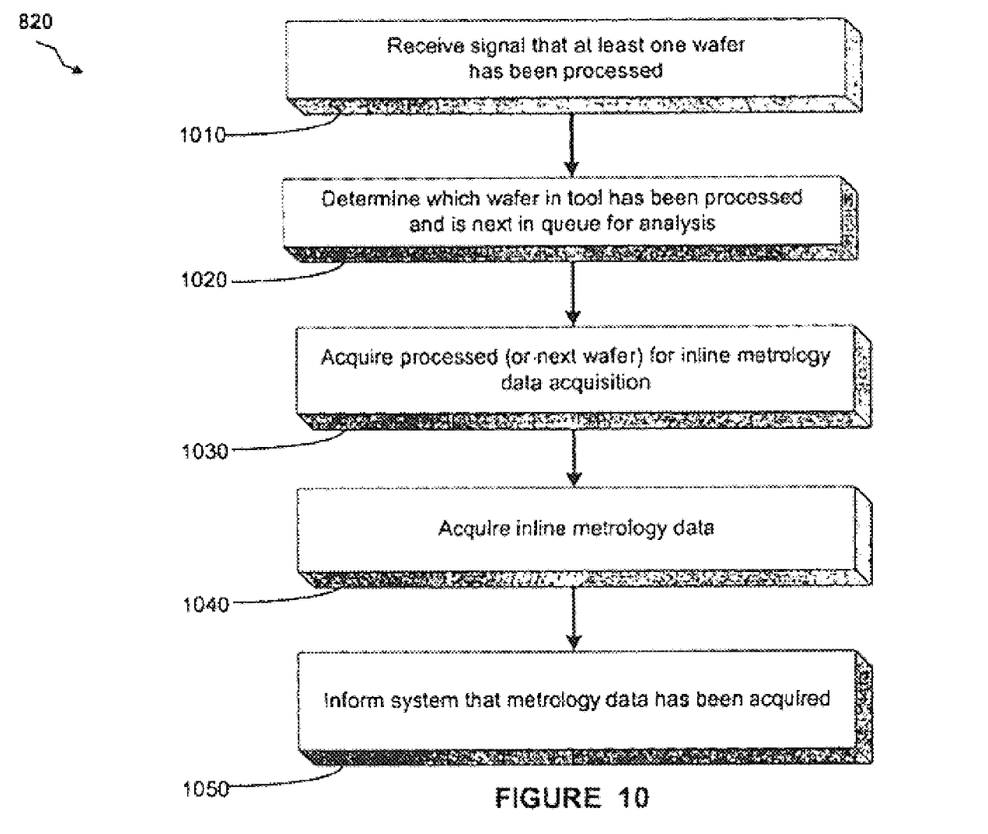
FIG. 10 illustrates a flowchart depiction of a method of acquiring pre-process metrology data, as indicated in FIG. 9, in accordance with illustrative one embodiment of the present invention.

Turning now to FIG. 10, a flowchart depiction of a method for acquiring inline metrology data, as indicated in blocks 910, 930, and 960, in accordance with one embodiment of the present invention is illustrated. In acquiring post-process data, after the system 300 processes a semiconductor wafer 105, a signal is received by the system 300 indicating that at least one semiconductor wafer 105 has been processed (block 1010). When the system 300 realizes that a set of semiconductor wafers 105 are available for metrology data acquisition, a determination is made as to which semiconductor wafer 105 in the processing tool 510 is next in queue for analysis (block 1020). Once the system 300 targets a particular semiconductor wafer 105 for inline metrology analysis, the processing tool 510 sends that particular semiconductor wafer 105 to the integrated metrology data tool 310 for inline metrology data acquisition (block 1030).

The system 300 then acquires inline metrology data from the targeted semiconductor wafer 105 (block 1040). The integrated metrology tool 310 within the processing tool 510 acquires the inline metrology data. Therefore, real time or near real time metrology data is provided to the system 300. Once inline metrology data is acquired, the process chamber 630 in the processing tool 510 is informed that metrology data has been acquired (block 1050). In one embodiment, the process chamber 630 informs the computer system 530 via the equipment interface 610 of the data acquisition, so the computer system 530 can execute an operation that is responsive to the inline metrology data. The steps described in FIG. 10 can be used to acquire pre-process and post-process metrology data, as indicated in blocks 910, 930, and 960 in FIG. 9. The completion of the steps illustrated in FIG. 10 substantially completes the process of acquiring inline metrology data, as indicated in blocks 910, 930, and 960 in FIG. 9.

Figure 11:
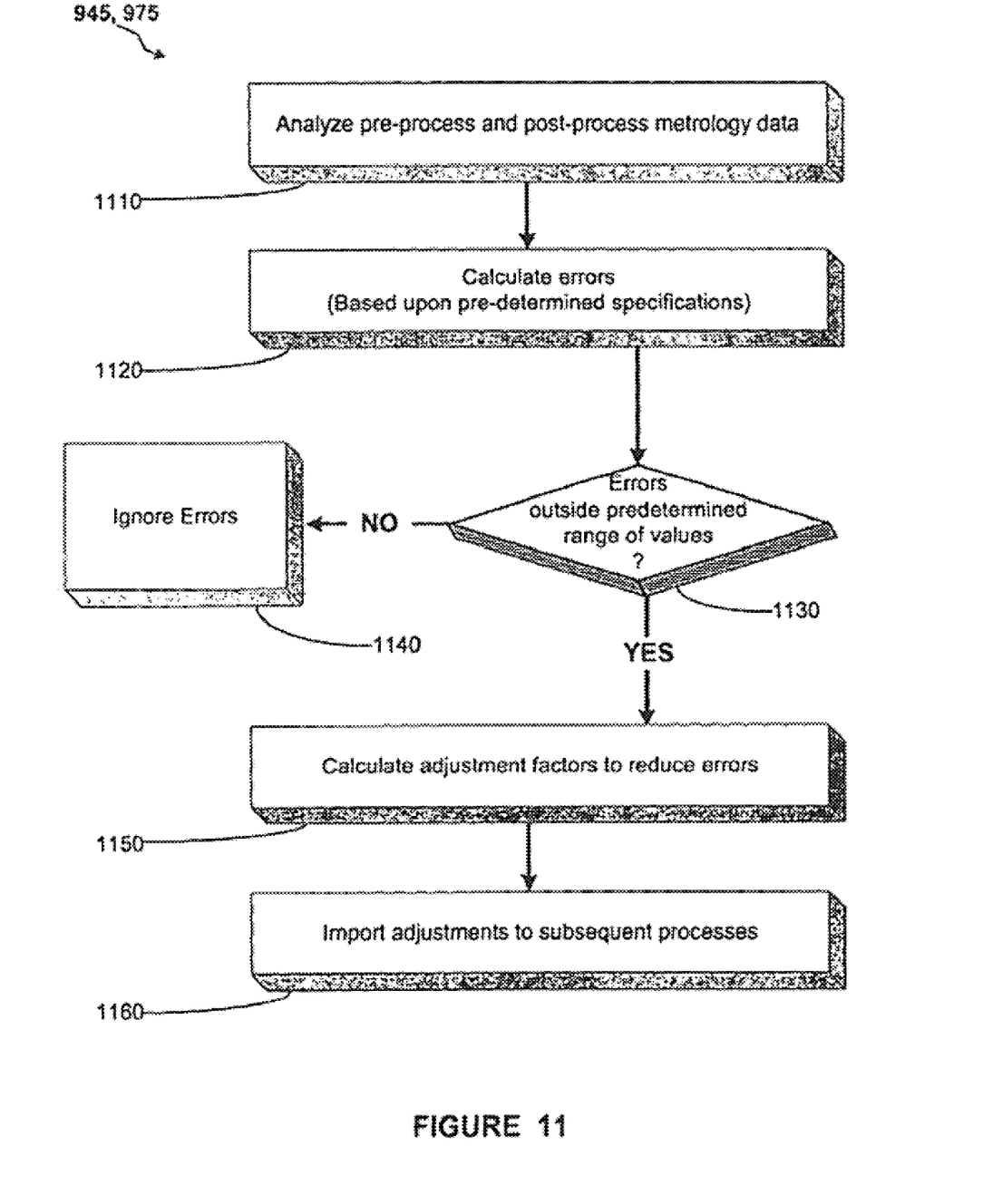
FIG. 11 illustrates a flowchart depiction of a method performing a metrology data feedback, as indicated in FIG. 9, in accordance with one illustrative embodiment of the present invention.

Turning now to FIG. 11, a flowchart depiction of one embodiment of performing the metrology feedback steps indicated in blocks 945 and 975 of FIG. 9 is illustrated. The system analyzes pre-process and post-process metrology data relating to a particular set of semiconductor wafers 105 (block 1110). For example, the pre-process and post-process metrology data relating to the first set of semiconductor wafers 105 is analyzed for a wafer-to-wafer feedback adjustment loop 705 and/or for a run-to-run feedback loop 700. The system calculates errors based upon the pre-process and post-process metrology data (block 1120). In one embodiment, the calculated errors are compared to a predetermined specification to determine if an error exists. For example, data relating to a trench deposited on the substrate on the semiconductor wafer 105 is compared to a predetermined range of acceptable values of such a trench, such as the critical dimension values, the angle of the side walls of the trench, the trench depth, and the like.

The system 300 then makes a determination whether the detected error is outside a predetermined range of acceptable values (block 1130). When the system 300 determines that the detected error is not outside a predetermined range of acceptable values, the system 300 generally ignores the error and continues normal processing operations (block 1140). When the system 300 determines that the error detected is outside an acceptable predetermined range of acceptable values, the system 300 calculates an adjustment factor for the control input parameters for subsequent processing of semiconductor wafers 105 (block 1150). In one embodiment, modifications to control input parameters are made in order to reduce the detected errors. The system 300 then imports the calculated adjustments in order to implement them on subsequent processing of semiconductor wafers 105 (block 1160). For example, modifications to the control adjustments for forming a trench structure on the substrate of a semiconductor wafer 105 are made to further refine the accuracy of subsequent trench structures. The feedback method described in FIG. 11 can be performed for a wafer-to-wafer feedback loop 705 as well as for a run-to-run feedback control loop 700. The teachings of the present invention can be utilized for a variety of processing procedures in semiconductor device manufacturing.

The principles taught by the present invention can be implemented in an Advanced Process Control (APC) Framework, such as a Catalyst system offered by KLA Tencor, Inc.

The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC is a preferred platform from which to implement the control strategy taught by the present invention. In some embodiments, the APC can be a factory-wide software system, therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   receiving a first semiconductor wafer for processing;
   receiving a second semiconductor wafer for processing; and
   performing a cascade processing operation upon said first and said second semiconductor wafers, wherein said cascade processing operation comprises acquiring pre-process metrology data related to said second semiconductor wafer during at least a portion of a time period wherein said first semiconductor wafer is being processed.

2. The method described in claim 1, further comprising acquiring post-process metrology data relating to said first semiconductor wafer during at least a portion of a time period wherein said second semiconductor wafer is being processed.

3. The method described in claim 2, further comprising performing a feed-forward process based upon said pre-process metrology.

4. The method described in claim 3, further comprising performing a subsequent process of a semiconductor wafer based upon said feed-forward process.

5. The method described in claim 4, wherein performing a feed-forward process based upon said pre-process metrology data further comprises performing a run-to-run feed-forward loop.

6. The method described in claim 5, wherein performing a run-to-run feed-forward loop further comprises modifying at least one control input parameter for processing a subsequent run of semiconductor wafers.

7. The method described in claim 6, wherein acquiring pre-process metrology data further comprises acquiring pre-process metrology data using an integrated metrology tool.

8. The method described in claim 6, wherein acquiring post-process metrology data further comprises acquiring post-process metrology data using an integrated metrology tool.

9. The method described in claim 2, further comprising performing a feedback process based said post-process metrology data, performing said feedback process comprising performing a wafer-to-wafer feedback loop.

10. The method described in claim 9, wherein performing said wafer-to-wafer feedback loop further comprises modifying at least one control input parameter for a subsequent processing of a semiconductor wafer.

11. The method described in claim 1, wherein receiving a first semiconductor wafer for processing further comprises receiving a first set of a plurality of semiconductor wafers.

12. The method described in claim 1, wherein receiving a second semiconductor wafer for processing further comprises receiving a second set of a plurality of semiconductor wafers.

13. The method described in claim 1, wherein performing a cascade processing operation upon said first and said second semiconductor wafer further comprises:
   acquiring pre-process metrology data related to said first semiconductor wafer;
   processing said first semiconductor wafer after acquiring said pre-process metrology data related to said first semiconductor wafer;
   acquiring pre-process metrology related to said second semiconductor wafer during at least a portion of a time period wherein said first semiconductor wafer being processed;
   acquiring post-process metrology data related to said first semiconductor wafer after said processing of said first semiconductor wafer;
   processing said second semiconductor wafer during at least a portion of a time period wherein post-process metrology data related to said first semiconductor wafer is acquired; and
   acquiring post-process metrology data in response to said processing of said second semiconductor wafer after said processing of said second semiconductor wafer.

14. A method, comprising:
   receiving a first semiconductor wafer for processing;
   receiving a second semiconductor wafer for processing;
   acquiring pre-process metrology data related to said first semiconductor wafer;
   processing said first semiconductor wafer after said acquiring of said pre-process metrology data related to said first semiconductor wafer;
   acquiring pre-process metrology related to said second semiconductor wafer during at least a portion of a time period wherein said first semiconductor wafer being processed;
   processing said second semiconductor wafer said acquiring of said pre-process metrology data related to said second semiconductor wafer; and
   acquiring post-process metrology data related to said first semiconductor wafer during at least a portion of a time period wherein said second semiconductor wafer is being processed; and
   acquiring post-process metrology data related to said second semiconductor wafer after said processing of said second semiconductor wafer.

15. The method described in claim 14, further comprising performing a feed-forward process based said pre-process metrology data.

16. The method described in claim 15, further comprising performing a subsequent process of a semiconductor wafer based upon said feed-forward process.

17. The method described in claim 16, wherein performing a feed-forward process based upon said pre-process metrology data further comprises performing a run-to-run feed-forward loop.

18. The method described in claim 17, wherein performing a run-to-run feed-forward loop further comprises modifying at least one control input parameter for processing a subsequent run of semiconductor wafers.

19. The method described in claim 18, wherein acquiring pre-process metrology data further comprises acquiring pre-process metrology data using an integrated metrology tool.

20. The method described in claim 18, wherein acquiring pre-process metrology data further comprises acquiring post-process metrology data using an integrated metrology tool.

21. The method described in claim 14, further comprising performing a feedback process based upon said post-process metrology data, performing said feedback process comprises performing a wafer-to-wafer feedback loop.

22. The method described in claim 21, wherein performing a wafer-to-wafer feedback loop further comprises modifying at least one control input parameter for a subsequent processing of a semiconductor wafer.

23. The method described in claim 14, wherein receiving a first semiconductor wafer for processing further comprises receiving a first set of a plurality of semiconductor wafers.

24. The method described in claim 14, wherein receiving a second semiconductor wafer for processing further comprises receiving a second set of a plurality of semiconductor wafers.

* * * * *